(12) United States Patent
Kitagawa et al.

(10) Patent No.: US 6,639,387 B2
(45) Date of Patent: Oct. 28, 2003

(54) BATTERY PACK AND INSPECTION DEVICE THEREFOR

(75) Inventors: Katsunori Kitagawa, Higashiosaka (JP); Tetsuo Nagahisa, Toyonaka (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 10/149,936

(22) PCT Filed: Oct. 19, 2001

(86) PCT No.: PCT/JP01/09225
§ 371 (c)(1),
(2), (4) Date: Jun. 14, 2002

(87) PCT Pub. No.: WO02/33768
PCT Pub. Date: Apr. 25, 2002

(65) Prior Publication Data
US 2002/0190693 A1 Dec. 19, 2002

(30) Foreign Application Priority Data
Oct. 20, 2000 (JP) .......................... 2000-320892

(51) Int. Cl.[7] .............................................. H01M 10/46
(52) U.S. Cl. ........................................ 320/134; 320/136
(58) Field of Search ................................ 320/127, 128, 320/132, 134, 135, 136, 137

(56) References Cited

U.S. PATENT DOCUMENTS 5,705,914 A * 1/1998 Morita
5,939,861 A * 8/1999 Joko et al.

FOREIGN PATENT DOCUMENTS

| JP | 8-182204 | 7/1996 |
| JP | 9-312172 | 12/1997 |
| JP | 11-102731 | 4/1999 |
| JP | 11-317245 | 11/1999 |
| JP | 2000-260483 | 9/2000 |

* cited by examiner

Primary Examiner—Edward H. Tso
(74) Attorney, Agent, or Firm—Jordan and Hamburg LLP

(57) ABSTRACT

A battery pack (2) having a reduced number of an inspection terminal (18) for inspecting operations of a battery protection circuit (11) for the battery pack (2), and an inspection device (1) for inspecting the operations of the battery protection circuit (11) for the battery pack (2) are provided. A voltage difference between an output voltage of a battery voltage memory circuit (41) for storing the voltage of a rechargeable battery (12), and an output voltage of a DC voltage power supply (42) is added to a voltage between a positive electrode input/output terminal (16) and a negative electrode input/output terminal (17), and the added voltage is provided for a control circuit (13) as an inspection voltage. Since the inspection terminal (18) serving as an input terminal for the inspection voltage and a wiring line are provided at one location, the size of a circuit board for constituting the battery protection circuit (11) is reduced, and the number of wiring lines is reduced for restraining an influence of electromagnetic radiation.

6 Claims, 3 Drawing Sheets

BATTERY PACK AND INSPECTION DEVICE
THEREFOR

TECHNICAL FIELD

The present invention relates to a battery pack which includes a battery, and a battery protection circuit for protecting the battery from overcharge and overdischarge, and has a reduced number of inspection terminal for inspecting the operation of the battery protection circuit. The invention also relates to an inspection device for a battery pack for inspecting the operation of the battery protection circuit.

BACKGROUND ART

A battery pack using a rechargeable battery having a high energy density such as a lithium ion rechargeable battery is provided with a battery protection circuit for protecting the rechargeable battery from overcharge and overdischarge. FIG. 3 shows a constitution of a battery pack 20 provided with a battery protection circuit 21, and a device for inspecting the operation of the battery protection circuit 21.

As shown in FIG. 3, the battery pack 20 includes a rechargeable battery 28, and the battery protection circuit 21. A control circuit 29 constituting this battery protection circuit 21 monitors the voltage of the rechargeable battery 28. The circuit 29 controls to set a first FET 26 serially connected with an input/output circuit of the rechargeable battery 28 to a cutoff state when a voltage in an overcharged state is detected, and stops charging the rechargeable battery 28. The control circuit 29 controls to set a second FET 27 serially connected with the input/output circuit of the rechargeable battery 28 to a cutoff state when a voltage in an overdischarged state is detected, and stops discharging the rechargeable battery 28. This operation of the control circuit 29 protects the rechargeable battery 28 from overcharge and overdischarge.

The battery pack 20 is provided with inspection terminals 24 and 25 which are connected with the control circuit 29, and are used for inspecting the operation of the battery protection circuit 21 in addition to a positive electrode input/output terminal 22 and a negative electrode input/output terminal 23.

When an overcharge protection operation is inspected, a charging power supply 30 and an ammeter 31 are connected between the positive electrode input/output terminal 22 and the negative electrode input/output terminal 23, and a constant voltage power supply 32 is connected with the inspection terminals 24 and 25 as shown in FIG. 3. The charging power supply 30 supplies a charging power for setting the battery pack 20 to a charging state, and the constant voltage power supply 32 impresses an overcharge inspection voltage, which sets the rechargeable battery 28 to an overcharged state, between the inspection terminals 24 and 25. The control circuit 29 detects this overcharge inspection voltage, and controls the first FET 26 to cut off the input/output circuit, and the ammeter 31 detects the cutoff of the input/output circuit. Thus, it is determined whether the overcharge protection operation of the battery protection circuit 21 is normal or not based on whether the read of the ammeter 31 is zero or not when the overcharge inspection voltage is impressed by the constant voltage power supply 32.

When an overdischarge protection operation is inspected, a discharging load 33 and the ammeter 31 are connected between the positive electrode input/output terminal 22 and the negative electrode input/output terminal 23, and the constant voltage power supply 32 is connected with the inspection terminals 24 and 25. Connecting the discharging load 33 sets the battery pack 20 to a discharging state, and the constant voltage power supply 32 impresses an overdischarge inspection voltage, which sets the rechargeable battery 28 to an overdischarged state, between the inspection terminals 24 and 25. The control circuit 29 detects this overdischarge inspection voltage, and controls the second FET 27 to cut off the input/output circuit, and the ammeter 31 detects the cutoff of the input/output circuit. Thus, it is determined whether the overdischarge protection operation of the battery protection circuit 21 is normal or not based on whether the read of the ammeter 31 is zero or not when the overdischarge inspection voltage is impressed by the constant voltage power supply 32.

However, since the battery pack 20 having the conventional constitution requires the two inspection terminals 24 and 25 for inspecting the battery protection circuit 21, there is such a problem as the area of a circuit board and the volume of a pack case increase. As the size and the thickness of portable devices on which the battery pack 20 is mounted reduce, reducing the size and the thickness of the battery pack 20 becomes necessary, and reducing the space for providing the inspection terminals 24 and 25 becomes desired.

Since wiring connected with the individual inspection terminals 24 and 25 may receive electromagnetic radiation from outside, or may generate unnecessary electromagnetic radiation to outside, the wiring may influence a device on which the battery pack 20 is mounted, or may cause a malfunction of the battery protection circuit 21.

An object of the present invention is to provide a battery pack using one inspection terminal to inspect the operation of the battery protection circuit, and an inspection device for the inspection.

DISCLOSURE OF THE INVENTION

A first aspect of the present invention is a battery pack which includes a rechargeable battery, a positive electrode input/output terminal connected with a positive electrode of the rechargeable battery, a negative electrode input/output terminal connected with a negative electrode of the battery, switching elements serially connected with an input/output circuit extending from the rechargeable battery to the positive electrode input/output terminal and the negative electrode input/output terminal, and a control circuit for monitoring a voltage between the positive and negative electrodes of the rechargeable battery, and setting the switching element to a cutoff state when an overcharge voltage in an overcharged state, or an overdischarge voltage in an overdischarged state is detected. The battery pack further includes an inspection terminal for outward extending a positive electrode voltage input terminal of the control circuit used for receiving the positive electrode voltage of the rechargeable battery, and a part between the inspection terminal and the negative electrode input/output terminal is constituted as an input unit for an inspection voltage for inspecting an overcharge protection operation and an overdischarge protection operation by the control circuit.

A second aspect of the invention is an inspection device for a battery pack which includes a rechargeable battery, a positive electrode input/output terminal connected with a positive electrode of the rechargeable battery, a negative electrode input/output terminal connected with a negative electrode of the battery, switching elements serially connected with an input/output circuit extending from the rechargeable battery to the positive electrode input/output terminal and the negative electrode input/output terminal, a control circuit for monitoring a voltage between the positive and negative electrodes of the rechargeable battery, and setting the switching element to a cutoff state when an overcharge voltage in an overcharged state, or an overdischarge voltage in an overdischarged state is detected, and an inspection terminal for outward extending a positive electrode voltage input terminal of the control circuit used for receiving the positive electrode voltage of the rechargeable battery. The inspection device detects an overcharge protection operation or an overdischarge protection operation of the battery pack by current detection means installed in a charging circuit or a discharging circuit while a charging power supply or a discharging load is connected between the positive electrode input/output terminal and the negative electrode input/output terminal of this battery pack, and an inspection voltage corresponding to the overcharge voltage or the overdischarge voltage is impressed on the control circuit. The inspection device is provided with inspection voltage generation means for generating the inspection voltage from a voltage between the positive electrode input/output terminal and the negative electrode input/output terminal, and impressing the inspection voltage between the inspection terminal and the negative electrode input/output terminal.

A third aspect of the invention is an inspection device for a battery pack which includes a rechargeable battery, a positive electrode input/output terminal connected with a positive electrode of the rechargeable battery, a negative electrode input/output terminal connected with a negative electrode of the battery, switching elements serially connected with an input/output circuit extending from the rechargeable battery to the positive electrode input/output terminal and the negative electrode input/output terminal, a control circuit for monitoring a voltage between the positive and negative electrodes of the rechargeable battery, and setting the switching element to a cutoff state when an overcharge voltage in an overcharged state, or an overdischarge voltage in an overdischarged state is detected, and an inspection terminal for outward extending a positive electrode voltage input terminal of the control circuit used for receiving the positive electrode voltage of the rechargeable battery. The inspection device detects an overcharge protection operation or an overdischarge protection operation of the battery pack by current detection means installed in a charging circuit or a discharging circuit while a charging power supply or a discharging load is connected between the positive electrode input/output terminal and the negative electrode input/output terminal of this battery pack, and an inspection voltage corresponding to the overcharge voltage or the overdischarge voltage is impressed on the control circuit. The inspection device is provided with a voltage memory circuit for storing the battery voltage of the rechargeable battery, a DC voltage power supply for generating voltages for inspecting the overcharge protection operation and the overdischarge protection operation, and a inspection voltage generation circuit for generating the inspection voltage from a voltage difference between an output voltage of the voltage memory circuit, and an output voltage of the DC voltage power supply, and a voltage between the positive electrode input/output terminal and the negative electrode input/output terminal, and impressing the inspection voltage between the inspection terminal and the negative electrode input/output terminal.

A fourth aspect of the invention is an inspection device for a battery pack which includes a rechargeable battery, a positive electrode input/output terminal connected with a positive electrode of the rechargeable battery, a negative electrode input/output terminal connected with a negative electrode of the battery, switching elements serially connected with an input/output circuit extending from the rechargeable battery to the positive electrode input/output terminal and the negative electrode input/output terminal, a control circuit for monitoring a voltage between the positive and negative electrodes of the rechargeable battery, and setting the switching element to a cutoff state when an overcharge voltage in an overcharged state is detected, and an inspection terminal for outward extending a positive electrode voltage input/output terminal of the control circuit used for receiving the positive electrode voltage of the rechargeable battery. The inspection device detects an overcharge protection operation of the battery pack by current detection means installed in a charging circuit while a charging power supply is connected between the positive electrode input/output terminal and the negative electrode input/output terminal of this battery pack, and an inspection voltage corresponding to the overcharge voltage is impressed on the control circuit. The charging power supply supplies a charging power having a voltage corresponding to the overcharge voltage, and the output voltage of the charging power supply is impressed between the inspection terminal and the negative electrode input/output terminal in a charging state where charging voltage generation means drops the output voltage from the charging power supply to a normal charging voltage, and the charging voltage is impressed between the positive electrode input/output terminal and the negative electrode input/output terminal.

With the above constitutions, since the negative electrode input/output terminal is shared by a negative electrode terminal on which the inspection voltage is impressed, and only the positive electrode inspection terminal is necessary, the conventional multiple inspection terminals are reduced to one location, the size of the circuit board is reduced. Further, since the number of wiring lines connected with the terminals is reduced, the electromagnetic radiation from the wiring and the influence of the external electromagnetic radiation on the device are reduced.

BEST MODE FOR CARRYING OUT THE INVENTION

The following describes embodiments of the present invention while referring to the attached drawings for comprehension of the invention. The embodiments described below are examples for embodying the present invention, and do not limit the technical scope of the invention.

Figure 1:
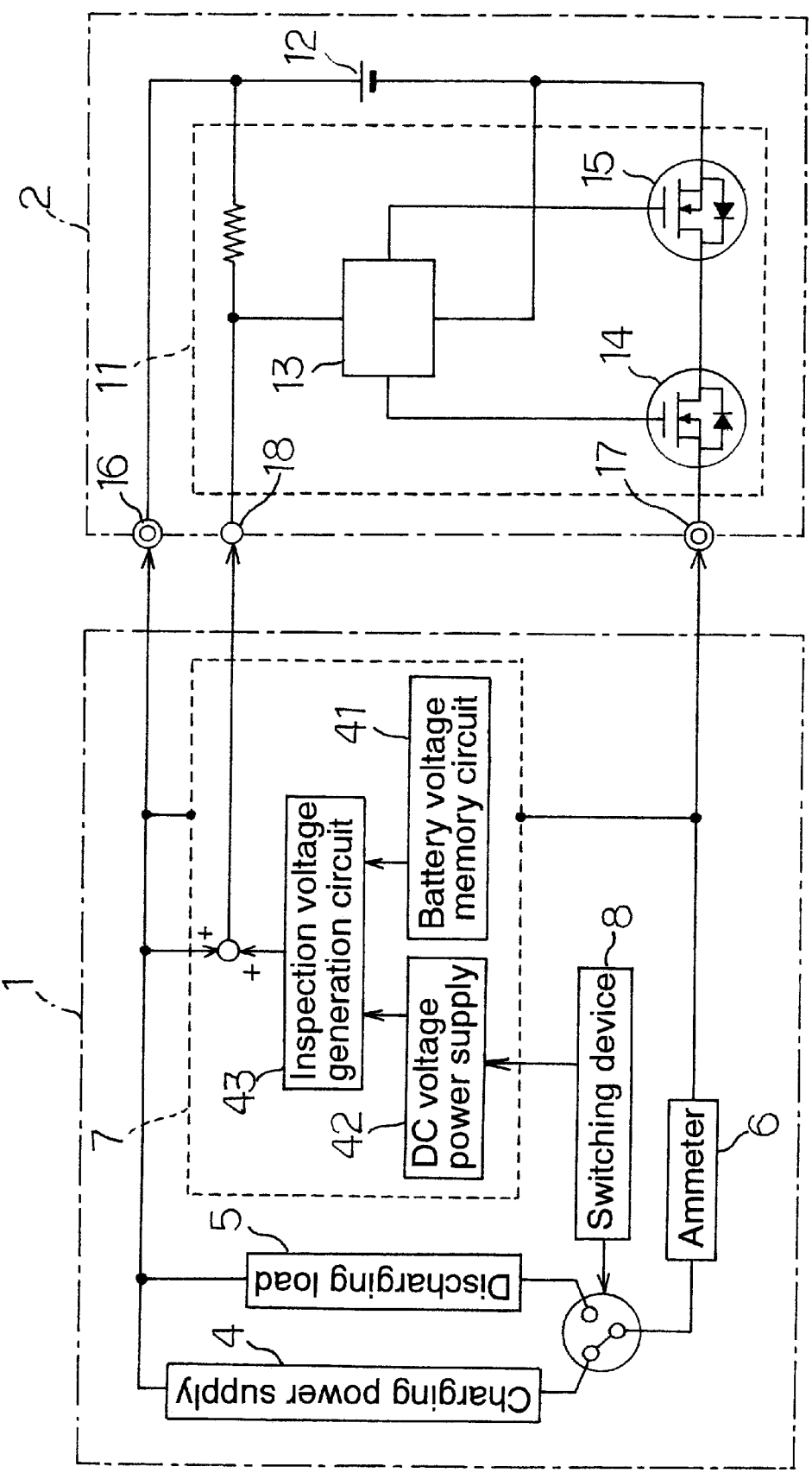
FIG. 1 is a block diagram showing a constitution of a battery pack and an inspection device according to a first embodiment of the present invention.

FIG. 1 shows a constitution of a battery pack 2, and an inspection device 1 for inspecting an overcharge protection operation and an overdischarge protection operation of this battery pack 2 according to a first embodiment of the invention.

The battery pack 2 includes a rechargeable battery 12, and a battery protection circuit 11 for protecting this rechargeable battery 12 from overcharge and overdischarge. The battery protection circuit 11 includes a control circuit 13, a first FET 14 and a second FET 15 as switching elements provided serially with a negative electrode input/output circuit of the rechargeable battery 12. The first and second FETs 14, 15 are normally in a conducting state. The control circuit 13 monitors a voltage between the positive electrode and the negative electrode of the rechargeable battery 12 to control to set the first FET 14 to a cutoff state when an overcharge voltage is detected, and to control to set the second FET 15 to a cutoff state when an overdischarge voltage is detected. Thus, when an overcharged state arises during charging where a battery charger is connected between a positive electrode input/output terminal 16 and a negative electrode input/output terminal 17 of the battery pack 2, the control circuit 13 detects the overcharge voltage. Then, the first FET 14 is controlled and is set to the cutoff state, and a charging circuit for the rechargeable battery 12 is cut off to protect the battery 12 from overcharge. When an overdischarged state arises during discharging where a device using the battery pack 2 is connected between the positive electrode input/output terminal 16 and the negative electrode input/output terminal 17, the control circuit 13 detects the overdischarge voltage. Then, the second FET 15 is controlled and is set to the cutoff state, and a discharging circuit for the rechargeable battery 12 is cut off to protect the battery 12 from overdischarge.

Figure 3:
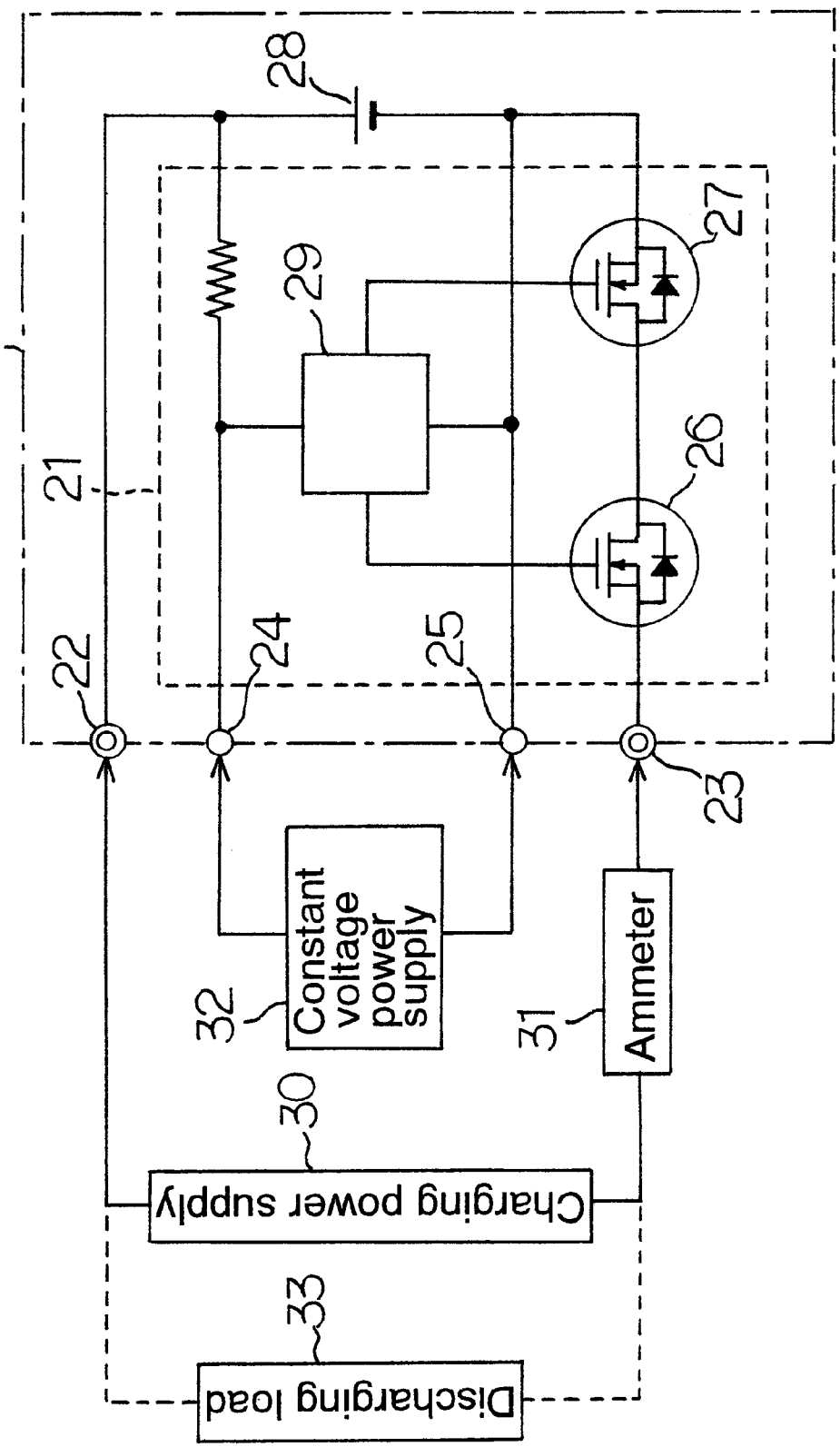
FIG. 3 is a block diagram showing a constitution of a battery pack and an inspection device of prior art.

An inspection terminal 18 connected with a positive electrode voltage input terminal of the control circuit 13 is provided as an external terminal for inspecting the operation of the battery protection circuit 11. Since the battery pack 2 has only the inspection terminal 18 as an external terminal for inspection, and it is not necessary to provide inspection terminals 24 and 25 at two locations as in the conventional constitution shown in FIG. 3, it is possible to reduce the number of the terminals and wiring lines connected with the terminals. As a result, it is possible to restrain unnecessary radiation from the wiring and malfunction and the like of the control circuit 13 caused by receiving electromagnetic radiation, and to reduce the size of a circuit board.

As shown in FIG. 1, the inspection device 1 is connected with the battery pack 2 for inspecting whether the overcharge protection operation and the overdischarge protection operation of the battery pack 2 constituted as described above are being conducted normally.

The inspection device 1 includes a charging power supply 4 for supplying the battery pack 2 with a charging power during the inspection of the overcharge protection operation, a discharging load 5 for discharging the battery pack 2 during the inspection of the overdischarge protection operation, an ammeter (current detection means) 6 for detecting a current in the charging circuit and the discharging circuit, an inspection circuit 7 for generating inspection voltages for inspecting the overcharge protection operation and the overdischarge protection operation, and a switching device 8 for switching between a device setting for the overcharge protection operation and that for the overdischarge protection operation.

The inspection circuit 7 is connected between the inspection terminal 18 and the negative electrode input/output terminal 17 of the battery pack 2. The circuit 7 includes a battery voltage memory circuit 41 for storing the voltage of the rechargeable battery 12, a DC voltage power supply 42 for generating a voltage according to the inspection for the overcharge protection operation and the inspection for the overdischarge protection operation, and an inspection voltage generation circuit 43 for generating the overcharge voltage and the overdischarge voltage based on voltages supplied from the DC voltage power supply 42 and the battery voltage memory circuit 41.

The inspection device 1 connects the charging power supply 4 and the discharging load 5 with the positive electrode input/output terminal 16 and the negative electrode input/output terminal 17 of the battery pack 2 through the ammeter 6. The switching device 8 provides a state where the charging power supply 4 is connected, and sets the output voltage of the DC voltage power supply 42 to a voltage for inspecting the overcharge protection operation when the overcharge protection operation is inspected. The charging power supply 4 supplies the charging power between the positive electrode input/output terminal 16 and the negative electrode input/output terminal 17 to set the battery pack 2 to the charging state, and an overcharge inspection voltage formed by adding the voltage generated by the inspection voltage generation circuit 43 to the voltage of the positive electrode input/output terminal 16 is supplied for the inspection terminal 18.

For example, when the battery voltage is 3.8 V, and a charging voltage is 4.1 V, the DC voltage power supply 42 provides a voltage of 4.4 V. The inspection voltage generation circuit 43 generates a voltage of 0.6 V which is a difference between the output voltage 4.4 V of the DC voltage power supply 42 and the battery voltage of 3.8 V, adds the voltage difference to the charging voltage of 4.1 V impressed on the positive electrode input/output terminal 16, and impresses the resultant overcharge inspection voltage of 4.7 V on the inspection terminal 18. This overcharge inspection voltage is a voltage of the rechargeable battery 12 in the overcharged state, and is provided for the positive electrode voltage input terminal of the control circuit 13 from the inspection terminal 18, and the control circuit 13 controls to set the first FET 14 to the cutoff state. Since the input/output circuit of the rechargeable battery 12 is cut off, the charging circuit is cut off and the detected value on the ammeter 6 becomes zero. As a result, it is possible to detect whether the overcharge protection operation is normal or not based on the read of the ammeter 6. With this constitution, the inspection terminal for the control circuit may be provided only at one location, and it is possible to reduce the size of the circuit board, and the influence of the electromagnetic radiation.

When the overdischarge protection operation is inspected, the switching device 8 provides a state where the discharging load 5 is connected between the positive electrode input/output terminal 16 and the negative electrode input/output terminal 17, and sets the output voltage of the DC voltage power supply 42 to a voltage for inspecting the overdischarge protection operation. Connecting the discharging load 5 sets the battery pack 2 to the discharging state, and an overdischarge inspection voltage formed by adding the voltage generated by the inspection voltage generation circuit 43 to the voltage of the positive electrode input/output terminal 16 is supplied for the inspection terminal 18.

For example, when the battery voltage is 3.8 V, the DC voltage power supply 42 provides a voltage of 2.5 V. The inspection voltage generation circuit 43 generates a voltage of −1.3 V which is a difference between the output voltage of 2.5 V of the DC voltage power supply 42 and the battery voltage of 3.8 V, adds the voltage difference to the discharging voltage 3.8 V impressed on the positive electrode input/output terminal 16, and impresses the resultant overdischarge inspection voltage of 2.5 V on the inspection terminal 18. This overdischarge inspection voltage is a voltage of the rechargeable battery 12 in the overdischarged state, and is provided for the positive electrode voltage input terminal of the control circuit 13 from the inspection terminal 18, and the control circuit 13 controls to set the second FET 15 to the cutoff state.

Since the input/output circuit of the rechargeable battery 12 is cut off, the discharging circuit is cut off and the detected value on the ammeter 6 becomes zero. As a result, it is possible to detect whether the overdischarge protection operation is normal or not based on the read of the ammeter 6. With this constitution, the inspection terminal for the control circuit may be provided only at one location, and it is possible to reduce the size of the circuit board, and the influence of the electromagnetic radiation.

Figure 2:
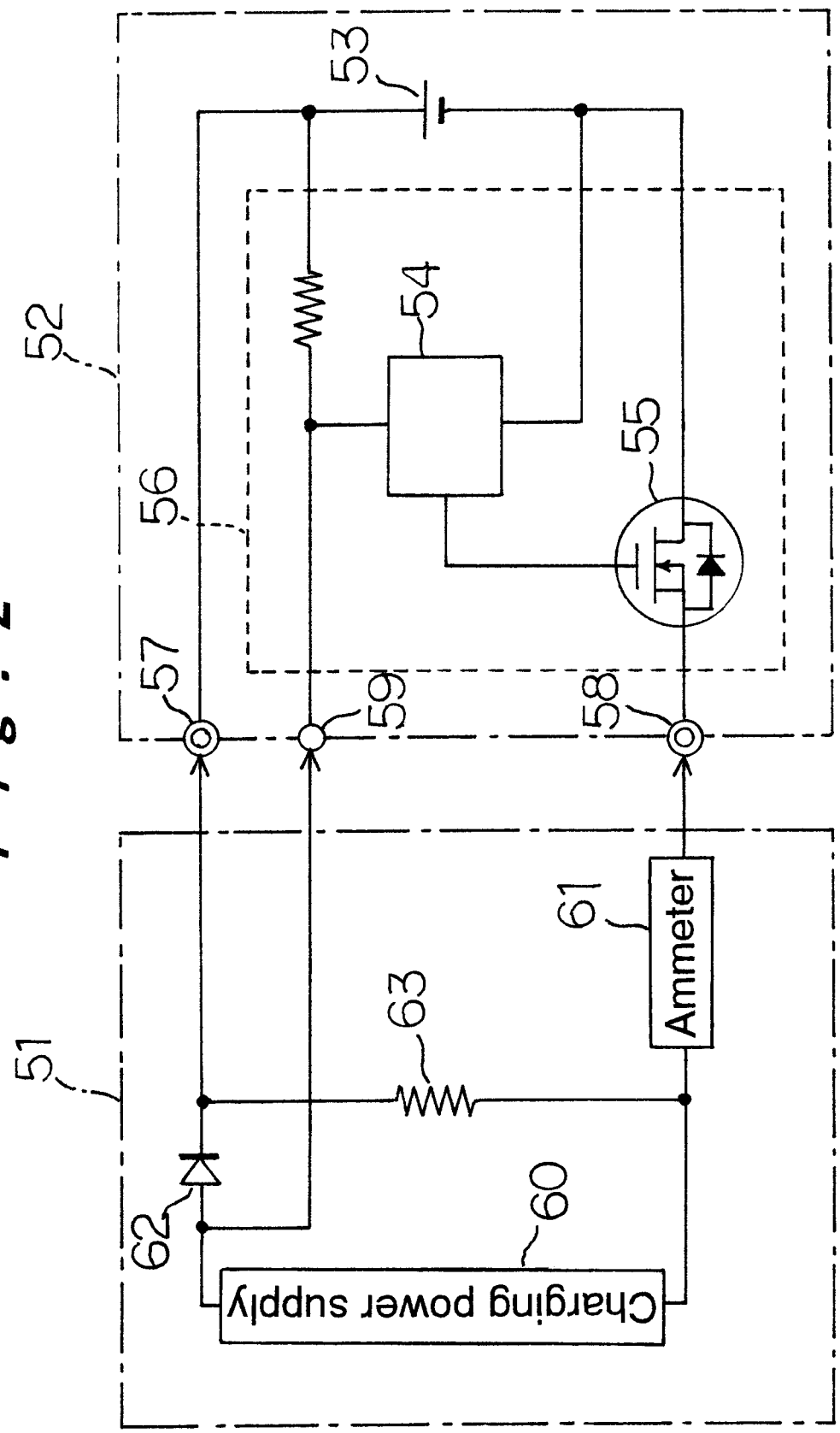
FIG. 2 is a block diagram showing a constitution of a battery pack and an inspection device according to a second embodiment of the invention.

FIG. 2 shows a constitution of a battery pack 52 and an inspection device 51 according to a second embodiment of the present invention. The battery pack 52 includes a rechargeable battery 53, and a battery protection circuit 56 for protecting this rechargeable battery 53 from overcharge.

A control circuit 54 constituting the battery protection circuit 56 monitors a battery voltage between the positive electrode and the negative electrode of the rechargeable battery 53, and controls to set an FET 55 provided serially with an input/output circuit of the rechargeable battery 53 to a cutoff state when the rechargeable battery 53 enters an overcharged state, and an overcharge voltage is detected. This overcharge protection operation protects the rechargeable battery 53 from a breakdown caused by the overcharge.

The inspection device 51 for inspecting the overcharge protection operation by the battery protection circuit 56 includes a charging power supply 60, an ammeter 61, and an overcharge inspection voltage generation circuit constituted by a diode 62 and a resistor 63. The positive electrode side of the charging power supply 60 is connected with a positive electrode input/output terminal 57 of the battery pack 52 through the diode 62, the negative electrode side is connected with a negative electrode input/output terminal 58 of the battery pack 52 through the ammeter 61, and the positive electrode side of the charging power supply 60 is connected with an inspection terminal 59 connected with a voltage inspection terminal of the control circuit 54.

When the charging power supply 60 supplies the battery pack 52 with a charging power, a charging voltage which is dropped by the forward voltage of the diode 62 is supplied for the positive electrode input/output terminal 57 of the battery pack 52, and the battery pack 52 enters the charging state. In this charging state, when the output voltage of the charging power supply 60 is impressed on the inspection terminal 59, the control circuit 54 detects a voltage higher than that at the positive electrode input/output terminal 57. If this voltage is set to the overcharge voltage, since the control circuit 54 controls to set the FET 55 to the cutoff state, the charging circuit is cut off, the charging stops, and the ammeter 61 detects this cutoff state.

Specifically, when the output voltage of the charging power supply 60 is set to 4.6 V which is the overcharge voltage of the rechargeable battery 53, and a diode having the forward voltage of 0.6 V is used as the diode 62, because the battery pack 52 is charged with the charging voltage of 4.0 V, and the overcharge voltage of 4.6 V is impressed on the inspection terminal 59, it is possible to inspect the overcharge protection operation while the battery pack 52 is being set to the charging state. With this constitution, since the inspection terminal on which the inspection voltage is impressed may be provided only at one location, the number of wiring lines is reduced. As a result, it is possible to reduce the size of a circuit board and an influence of electromagnetic radiation.

INDUSTRIAL APPLICABILITY

According to the present invention, since providing an inspection terminal only at one location on a battery pack enables inspecting an operation of a battery protection circuit, the invention has such an advantage as reducing the size of a circuit board constituting the battery protection circuit. Since the number of wiring lines for the inspection terminals is reduced as the number of the inspection terminals is reduced, the invention is appropriate for reducing malfunction of the battery protection circuit when the wiring lines receive electromagnetic radiation, and reducing influence on a device when electromagnetic radiation is generated from the wiring lines.

What is claimed is:

1. A battery pack comprising:
    a rechargeable battery;
    a positive electrode input/output terminal connected with a positive electrode of the rechargeable battery;
    a negative electrode input/output terminal connected with a negative electrode of the rechargeable battery;
    switching elements serially connected with an input/output circuit extending from said rechargeable battery to said positive electrode input/output terminal and said negative electrode input/output terminal; and
    a control circuit for monitoring a voltage between the positive and negative electrodes of said rechargeable battery, and setting said switching element to a cutoff state when an overcharge voltage in an overcharged state, or an overdischarge voltage in an overdischarged state is detected, wherein
    the battery pack is provided with an inspection terminal for outward extending a positive electrode voltage input terminal of said control circuit used for receiving the positive electrode voltage of said rechargeable battery, and
    a part between said inspection terminal and said negative electrode input/output terminal is constituted as an input unit for an inspection voltage for inspecting an overcharge protection operation and an overdischarge protection operation by the control circuit.

2. An inspection device for a battery pack which includes a rechargeable battery, a positive electrode input/output terminal connected with a positive electrode of the rechargeable battery, a negative electrode input/output terminal connected with a negative electrode of the rechargeable battery, switching elements serially connected with an input/output circuit extending from said rechargeable battery to said positive electrode input/output terminal and said negative electrode input/output terminal, a control circuit for monitoring a voltage between the positive and negative electrodes of said rechargeable battery, and setting said switching element to a cutoff state when an overcharge voltage in an overcharged state, or an overdischarge voltage in an overdischarged state is detected, and an inspection terminal for outward extending a positive electrode voltage input terminal of said control circuit used for receiving the positive electrode voltage of said rechargeable battery,
    the inspection device for detecting an overcharge protection operation or an overdischarge protection operation of said battery pack by an ammeter installed in a charging circuit or a discharging circuit while a charging power supply or a discharging load is connected between said positive electrode input/output terminal and said negative electrode input/output terminal of the battery pack, and an inspection voltage corresponding to said overcharge voltage or said overdischarge voltage is impressed on said control circuit, wherein the inspection device is provided with an inspection circuit for generating said inspection voltage from a voltage between said positive electrode input/output terminal and said negative electrode input/output terminal, and impressing said inspection voltage between said inspection terminal and said negative electrode input/output terminal.

3. An inspection device for a battery pack which includes a rechargeable battery, a positive electrode input/output terminal connected with a positive electrode of the rechargeable battery, a negative electrode input/output terminal connected with a negative electrode of the rechargeable battery, switching elements serially connected with an input/output circuit extending from said rechargeable battery to said positive electrode input/output terminal and said negative electrode input/output terminal, a control circuit for monitoring a voltage between the positive and negative electrodes of said rechargeable battery, and setting said switching element to a cutoff state when an overcharge voltage in an overcharged state, or an overdischarge voltage in an overdischarged state is detected, and an inspection terminal for outward extending a positive electrode voltage input terminal of said control circuit used for receiving the positive electrode voltage of said rechargeable battery, the inspection device for detecting an overcharge protection operation or an overdischarge protection operation of said battery pack by an ammeter installed in a charging circuit or a discharging circuit while a charging power supply or a discharging load is connected between said positive electrode input/output terminal and said negative electrode input/output terminal of the battery pack, and an inspection voltage corresponding to said overcharge voltage or said overdischarge voltage is impressed on said control circuit, wherein the inspection device is provided with a battery voltage memory circuit for storing the voltage of said rechargeable battery, a DC voltage power supply for generating voltages for inspecting the overcharge protection operation and the overdischarge protection operation, and an inspection voltage generation circuit for generating said inspection voltage from a voltage difference between an output voltage of said battery voltage memory circuit, and an output voltage of said DC voltage power supply and a voltage between said positive electrode input/output terminal and said negative electrode input/output terminal, and impressing said inspection voltage between said inspection terminal and said negative electrode input/output terminal.

4. The inspection device for a battery pack according to claim 3, wherein connection with the positive electrode input/output terminal and the negative electrode input/output terminal is switched between the charging power supply and the discharging load, and simultaneously an operation state of the inspection voltage generation circuit is switched according to the inspection of the overcharge protection operation and the overdischarge protection operation.

5. An inspection device for a battery pack which includes a rechargeable battery, a positive electrode input/output terminal connected with a positive electrode of the rechargeable battery, a negative electrode input/output terminal connected with a negative electrode of the rechargeable battery, a switching element serially connected with an input/output circuit extending from said rechargeable battery to said positive electrode input/output terminal and said negative electrode input/output terminal, a control circuit for monitoring a voltage between the positive and negative electrodes of said rechargeable battery, and setting said switching element to a cutoff state when an overcharge voltage in an overcharged state is detected, and an inspection terminal for outward extending a positive electrode voltage input/output terminal of said control circuit used for receiving the positive electrode voltage of said rechargeable battery, the inspection device for detecting an overcharge protection operation of said battery pack by an ammeter installed in a charging circuit while a charging power supply is connected between said positive electrode input/output terminal and said negative electrode input/output terminal of the battery pack, and an inspection voltage corresponding to said overcharge voltage is impressed on said control circuit, wherein said charging power supply supplies a charging power having a voltage corresponding to said overcharge voltage, and the output voltage of said charging power supply is impressed between said inspection terminal and said negative electrode input/output terminal in a charging state where charging voltage generation means drops the output voltage from the charging power supply to a normal charging voltage, and the charging voltage is impressed between said positive electrode input/output terminal and said negative electrode input/output terminal.

6. The inspection device for a battery pack according to claim 5, wherein the charging voltage generation means impresses the output voltage of the charging power supply between the positive electrode input/output terminal and the negative electrode input/output terminal through a diode having a predetermined forward voltage.

* * * * *